(12) United States Patent
Kumar et al.

(10) Patent No.: US 10,439,649 B2
(45) Date of Patent: *Oct. 8, 2019

(54) DATA DEPENDENCY MITIGATION IN DECODER ARCHITECTURE FOR GENERALIZED PRODUCT CODES FOR FLASH STORAGE

(71) Applicant: SK Hynix Inc., Gyeonggi-do (KR)

(72) Inventors: Naveen Kumar, San Jose, CA (US); Yi-Min Lin, San Jose, CA (US); Aman Bhatia, San Jose, CA (US)

(73) Assignee: SK Hynix Inc., Gyeonggi-do (KR)

( * ) Notice: Subject to any disclaimer, the term of this patent is extended or adjusted under 35 U.S.C. 154(b) by 131 days.

This patent is subject to a terminal disclaimer.

(21) Appl. No.: 15/411,773

(22) Filed: Jan. 20, 2017

(65) Prior Publication Data

US 2017/0222662 A1    Aug. 3, 2017

Related U.S. Application Data

(60) Provisional application No. 62/354,002, filed on Jun. 23, 2016, provisional application No. 62/290,749, filed on Feb. 3, 2016.

(51) Int. Cl.
*H03M 13/00* (2006.01)
*H03M 13/29* (2006.01)
*H03M 13/15* (2006.01)

(52) U.S. Cl.
CPC ... *H03M 13/2927* (2013.01); *H03M 13/1555* (2013.01); *H03M 13/2909* (2013.01); *H03M 13/152* (2013.01)

(58) Field of Classification Search
CPC ......... H03M 13/1555; H03M 13/2909; H03M 13/2927; H03M 13/152; H03M 13/2942; H03M 2201/16

(Continued)

(56) References Cited

U.S. PATENT DOCUMENTS 4,617,664 A    10/1986 Aichelmann et al.
5,477,551 A    12/1995 Parks et al.

(Continued)

OTHER PUBLICATIONS

Jord Justesen, "Performance of Product Code and Related Structures with Iterated Decoding" IEEE Transactions on Communication, vol. 59, No. 2, Feb. 2011, 9 pages.

(Continued)

*Primary Examiner* — Albert Decady
*Assistant Examiner* — Osman M Alshack
(74) *Attorney, Agent, or Firm* — Kilpatrick Townsend & Stockton LLP

(57) ABSTRACT

A memory device includes a memory array, a processor coupled to the memory array, and a decoding apparatus. The decoding apparatus is configured to perform coarse decoding and fine decoding. In coarse decoding, the decoder decodes in parallel two or more codewords, which share a common block of bits, to determine error information. Next, the decoder corrects errors in a first codeword based on the error information. Then, it is determined if the shared common block of data bits is corrected. If the shared common data block is updated, then error correction based on the error information is prohibited in codewords sharing the common block of data bits with the first codeword. In fine decoding, a single codeword is decoded at a time for error correction.

21 Claims, 13 Drawing Sheets

(58) Field of Classification Search
USPC .................. 714/752, 755, 781, 782, 785
See application file for complete search history.

(56) References Cited

U.S. PATENT DOCUMENTS

| | | | |
|---|---|---|---|
| 5,517,514 A | 5/1996 | Norrie et al. | |
| 6,047,395 A | 4/2000 | Zook | |
| 6,052,815 A * | 4/2000 | Zook | G11B 20/1833 714/758 |
| 7,356,752 B2 | 4/2008 | Hewitt et al. | |
| 8,156,400 B1 | 4/2012 | Yeo et al. | |
| 8,429,498 B1 * | 4/2013 | Anholt | G06F 11/1048 365/227 |
| 8,468,430 B2 | 6/2013 | Shin et al. | |
| 8,887,020 B2 * | 11/2014 | Shokrollahi | H03M 13/3761 714/752 |
| 9,231,623 B1 | 1/2016 | Kumar et al. | |
| 9,559,727 B1 | 1/2017 | Kumar et al. | |
| 9,998,148 B2 | 6/2018 | Lin et al. | |
| 2001/0050622 A1 | 12/2001 | Hewitt et al. | |
| 2002/0007474 A1 | 1/2002 | Fujita et al. | |
| 2004/0025106 A1 | 2/2004 | Massey | |
| 2004/0054651 A1 * | 3/2004 | Katayama | G11B 20/1833 |
| 2008/0134004 A1 * | 6/2008 | Park | G11B 20/1833 714/763 |
| 2010/0088575 A1 * | 4/2010 | Sharon | G06F 11/1072 714/763 |
| 2010/0199149 A1 * | 8/2010 | Weingarten | G06F 11/1068 714/773 |
| 2011/0258514 A1 | 10/2011 | Lasser | |
| 2012/0317460 A1 | 12/2012 | Chilappagari et al. | |
| 2014/0095960 A1 | 4/2014 | Chu et al. | |
| 2014/0129896 A1 * | 5/2014 | Parthasarathy | H03M 13/1108 714/755 |
| 2014/0129899 A1 | 5/2014 | Kumar | |
| 2015/0309869 A1 | 10/2015 | Mittelholzer et al. | |
| 2015/0309875 A1 | 10/2015 | Mittelholzer | |
| 2016/0142075 A1 | 5/2016 | Maehata | |
| 2016/0285478 A1 | 9/2016 | Fujiwara | |
| 2016/0342467 A1 | 11/2016 | Kumar et al. | |
| 2017/0257121 A1 | 9/2017 | Kwok | |
| 2017/0279468 A1 | 9/2017 | Kumar et al. | |
| 2017/0331500 A1 | 11/2017 | Bhatia et al. | |
| 2017/0373706 A1 | 12/2017 | Lin et al. | |

OTHER PUBLICATIONS

Final Office Action for U.S. Appl. No. 15/158,425 dated Oct. 15, 2018, 9 pages.
Non-Final Office Action for U.S. Appl. No. 15/158,425 dated Mar. 21, 2018, 12 pages.
Notice of Allowance for U.S. Appl. No. 15/158,425 dated Dec. 18, 2018, 5 pages.
Non-Final Office Action for U.S. Appl. No. 15/460,155 dated Oct. 16, 2018, 11 pages.
Restriction Requirement for U.S. Appl. No. 15/460,155 dated May 2, 2018, 6 pages.
Non-Final Office Action for U.S. Appl. No. 15/582,278 dated Sep. 20, 2018, 11 pages.
Non-Final Office Action for U.S. Appl. No. 15/668,565 dated Jan. 11, 2019, 11 pages.
Sklar, et al., "The ABCs of linear block codes", IEEE Signal Processing Magazine, vol. 21, Issue 4, Jul. 19, 2004, pp. 14-35.
Therattil, et al., "A Low-complexity Soli-decision Decoder for Extended BCH and RS-Like Codes", In Proc. IEEE Int. Symp. Inf. Theory, Sep. 2005, pp. 1320-1324.
U.S. Appl. No. 15/460,155, "Final Office Action", dated May 1, 2019, 8 pages.
U.S. Appl. No. 15/582,278, "Final Office Action", dated Apr. 18, 2019, 16 pages.
U.S. Appl. No. 15/668,565, "Ex Parte Quayle Action", dated May 1, 2019, 6 pages.
U.S. Appl. No. 15/158,425, "Notice of Allowance", dated Apr. 19, 2019, 5 pages.

* cited by examiner

DATA DEPENDENCY MITIGATION IN DECODER ARCHITECTURE FOR GENERALIZED PRODUCT CODES FOR FLASH STORAGE

CROSS-REFERENCES TO RELATED APPLICATIONS

The present application claims priority to U.S. Provisional Application No. 62/290,749, entitled "Data Dependency Mitigation In Decoder Architecture For Generalized Product Codes," filed Feb. 3, 2016, and U.S. Provisional Application No. 62/354,002, entitled "An Improved Data Dependency Mitigation Scheme For Generalized Product Codes," filed Jun. 23, 2016, all of which are commonly assigned and expressly incorporated by reference herein in their entirety.

This application is related to U.S. patent application Ser. No. 15/158,425 entitled "Generalized Product Codes For NAND Flash Storage," filed May 18, 2016, which is commonly assigned and expressly incorporated by reference herein in its entirety.

BACKGROUND OF THE INVENTION

The term "error correcting code (ECC)" is used herein to refer to a process of adding redundant data, or parity data, to a message, such that it can be recovered by a receiver even when a number of errors were introduced, either during the process of transmission, or storage. In general, the ECC can correct the errors up to the capability of the code being used. Error-correcting codes are frequently used in communications, as well as for reliable storage in media such as CDs, DVDs, hard disks, and random access memories (RAMs), flash memories, solid state disk (SSD), and the like.

In NAND flash storage enterprise applications, high read throughput is a key requirement. Read latency can be reduced significantly if the ECC decoder is able to decode the data using a single read from the NAND media (hard decoding). This motivated the ECC research to improve performance for the hard decoding. With recent research findings for product codes, it has been confirmed that this class of codes provides better decoding performance compared to BCH and LDPC code with a low complexity encoder/decoder when a single NAND read operation is performed.

The inventors have proposed a class of improved product codes, as described in U.S. patent application Ser. No. 15/158,425 entitled "Generalized Product Codes For NAND Flash Storage," filed May 18, 2016, which is commonly assigned and expressly incorporated by reference herein in its entirety. This class of improved product codes, referred to as generalized product codes (GPC), has been shown to provide improved performance, for example, lower error floor.

BRIEF SUMMARY OF THE INVENTION

The inventors have observed that, unlike turbo product codes, GPCs have a structure such that every pair of constituent codewords share a certain number of data bits among each other (referred to as intersection of these codewords). If two decoders are operated in parallel to decode a pair of constituent codewords, each decoder may try to correct bits in their intersection. This causes a clash in updating the errors in data bits, and the hardware implementation of this decoder may behave in an unpredictable manner. This data dependency among constituent codes is also problematic when single-constituent-decoder architecture with several pipeline stages is used. Moreover, this problem becomes severe when the number of component decoders that run in parallel is increased.

In embodiments of this invention disclosure, a decoder is configured to decode multiple constituent decoders in parallel to meet the desired throughput. The proposed decoder architecture mitigates the data dependency issue with minimal loss in the throughput compared with an upper bound obtained using an idealized hypothetical decoder.

According to some embodiments of the present invention, a memory device includes a memory array, a processor coupled to the memory array, and a decoding apparatus. The decoding apparatus is configured to perform coarse decoding and fine decoding. In some embodiments, the fine decoding is performed only if it is determined that coarse decoding has failed to decode the codewords successfully. In coarse decoding, the decoder decodes in parallel two or more codewords, which shares a common block of bits, to determine error information. Next, the decoder corrects errors in a first codeword based on the error information. Then, it is determined if the shared common block of data bits is corrected. If the shared common data block is updated, then error correction based on the error information is prohibited in codewords sharing the common block of data bits with the first codeword. In fine decoding, a single codeword is decoded at a time for error correction.

According to some embodiments of the present invention, a decoding apparatus is configured for decoding a plurality of codewords in parallel. The apparatus includes a memory and a processor coupled to the memory. The processor is configured to read encoded data including a plurality of codewords, which is encoded in a product code in which each codeword has multiple blocks of data bits and every two codewords share a common block with each other. One or more decoders are configured to perform parallel decoding of two or more codewords. The apparatus is configured to perform coarse decoding and fine decoding. In some embodiments, the fine decoding is performed only if it is determined that coarse decoding has failed to decode the codewords successfully. In the coarse decoding, the apparatus is configured to perform parallel decoding of two or more codewords to determine error information, and update a first codeword if the error information indicates that an error exists. The apparatus also determines if the common block between the first and second codewords is updated, and updates the second codeword based on the error information, unless the common block is updated in the decoding of the first codeword. In the fine decoding, the codewords are decoded one at a time.

According to some embodiments of the present invention, a method for decoding data includes reading, from a memory device, encoded data including a plurality of codewords. The method includes decoding in parallel two or more codewords that share a common block of data bits, to determine error information, and correcting errors in a first codeword based on the error information. The method also determines if the shared common block of data bits is corrected, and, if so determined, preventing error correction based on the error information in codewords sharing a common block of data bits with the first codeword. The method can also include decoding a single codeword at a time for error correction.

BRIEF DESCRIPTION OF THE DRAWINGS

An understanding of the nature and advantages of various embodiments may be realized by reference to the following figures. In the appended figures, similar components or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION OF THE INVENTION

Figure 1A:
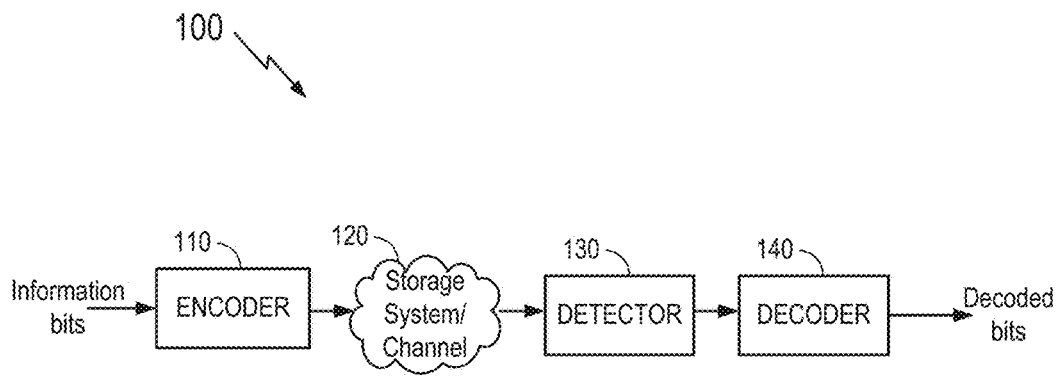
FIG. 1A is a simplified block diagram illustrating a data communication system in accordance with certain embodiments of the present invention.

FIG. 1A a simplified block diagram illustrating a data communication system 100 in accordance with certain embodiments of the present invention. In the example shown, encoder 110 receives information bits that include data which is desired to be stored in a storage system 120 or transmitted in a communications channel. The encoded data is output by encoder 110 and is written to storage 120. In various embodiments, storage 120 may include a variety of storage types or media such as (e.g., magnetic) disk drive storage, Flash storage, etc. In some embodiments, the techniques described herein are employed in a transceiver and instead of being written to or read from storage, the data is transmitted and received over a wired and/or wireless channel. In this case, the errors in the received codeword may be introduced during transmission of the codeword.

When the stored data is requested or otherwise desired (e.g., by an application or user which stored the data), detector 130 receives the data from the storage system. The received data may include some noise or errors. Detector 130 performs detection on the received data and outputs decision and/or reliability information corresponding to one or more bits in a codeword. For example, a soft-output detector outputs reliability information and a decision for each detected bit. On the other hand, a hard output detector outputs a decision on each bit without providing corresponding reliability information. As an example, a hard output detector may output a decision that a particular bit is a "1" or a "0" without indicating how certain or sure the detector is in that decision. In contrast, a soft output detector outputs a decision and reliability information associated with the decision. In general, a reliability value indicates how certain the detector is in a given decision. In one example, a soft output detector outputs a log-likelihood ratio (LLR) where the sign indicates the decision (e.g., a positive value corresponds to a "1" decision and a negative value corresponds to a "0" decision) and the magnitude indicates how sure or certain the detector is in that decision (e.g., a large magnitude indicates a high reliability or certainty).

The decision and/or reliability information is passed to decoder 140 which performs decoding using the decision and reliability information. A soft input decoder utilizes both the decision and the reliability information to decode the codeword. A hard decoder utilizes only the decision values in the decoder to decode the codeword. After decoding, the decoded bits generated by the decoder are passed to the appropriate entity (e.g., the user or application which requested it). With proper encoding and decoding, the information bits match the decoded bits.

Figure 1B:
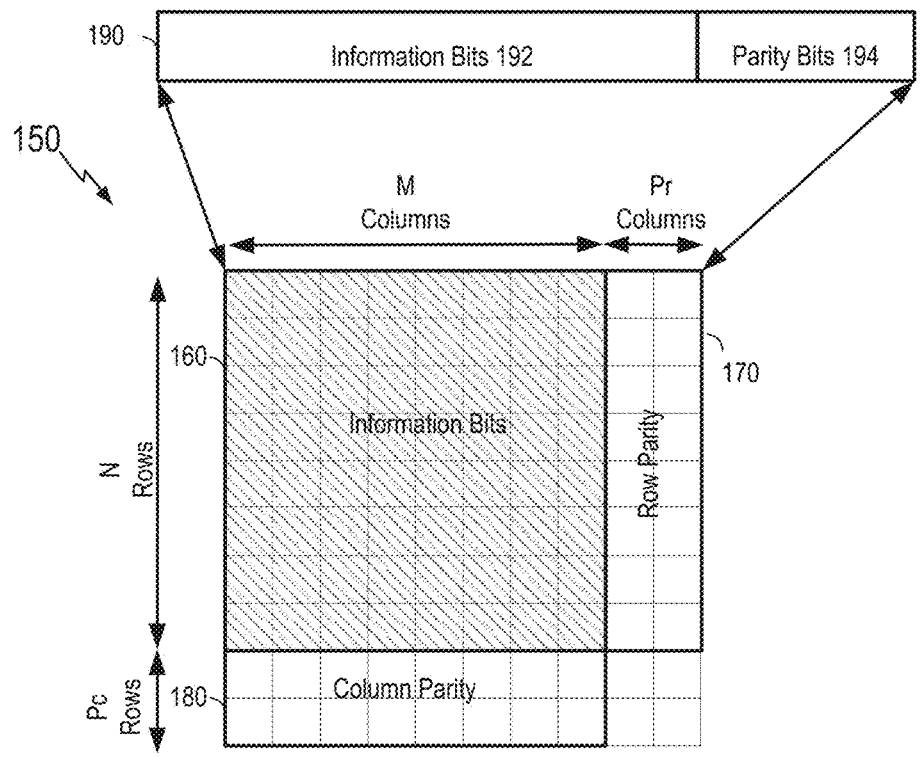
FIG. 1B is a simplified block diagram illustrating a conventional product code.

FIG. 1B is a simplified block diagram illustrating a conventional product code. FIG. 1B illustrates a two-dimensional turbo product code (TPC) codeword 150. As illustrated, the TPC codeword 150 may be a matrix of size $(N+P_c) \times (M+P_r)$, in which N represents number of rows of information bits, M represents number of columns of information bits, $P_r$ represents number of row parity bits and $P_c$ represents number of column parity bits. Information bits can be represented by a matrix of size N×M (e.g., matrix 160), row parity bits can be represented by a matrix of size N×$P_r$ (e.g., matrix 170), and Column parity bits may be represented by a matrix of size $P_c$×M (e.g., matrix 180). The TPC codeword may include N row codewords and M column codewords. Each row codeword 190 includes multiple information bits 192 and one or more parity bits 194. Similarly, each column codeword includes multiple information bits and one or more parity bits. As an example, if row constituent code is a BCH code, the row codewords 1 through N are constructed using BCH encoding. Similarly, column codewords 1 through M are generated using an error correcting constituent code (e.g., BCH code, Reed Solomon code, etc.

As an example, if the row constituent code has a code rate of 0.9, the row codeword may include 90 information bits and 10 parity bits. In general, row codewords and column codewords may have any code rate, without departing from the teachings of the present disclosure. To obtain the row and column parity bits, a TPC encoder (not shown) first encodes the N rows of information bits (shown as shaded blocks) to generate the N row parity bit groups. Then, the TPC encoder encodes the M columns of information bits to generate the M column parity bit sets.

Figure 2A:
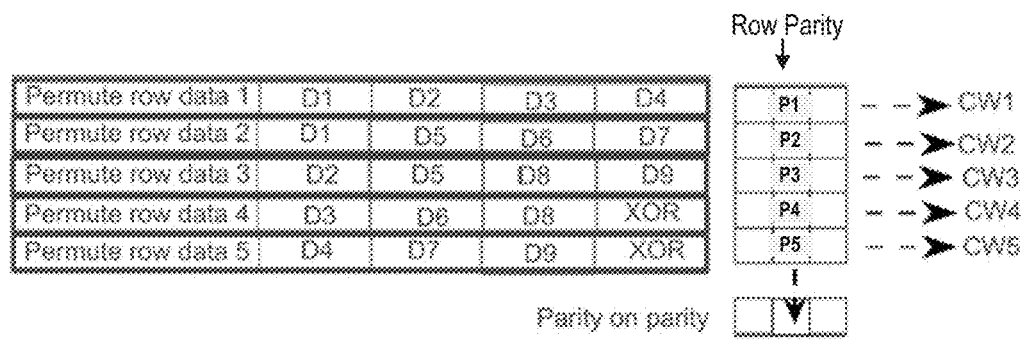
FIG. 2A is a simplified block diagram illustrating a generalized product code (GPC) in accordance with certain embodiments of the present invention.

FIGS. 2A-2G are simplified schematic diagrams illustrating a generalized product code (GPC) in accordance with certain embodiments of the present invention. As an example, a GPC is a product code in which information bits are grouped in blocks; the blocks of information bits and one or more XOR parity blocks are arranged in a rectangular matrix of data blocks. In the example of FIG. 2A, the data blocks of information bits are numbered D1-D9, and each block Dk contains I bits, where I is a positive integer. Each row data is permuted and the codeword parity is constructed on the permuted data, which is shown as Row Parity in FIG. 2A. For example, codeword CW1 includes data blocks D1, D2, D3, and D4, as well as parity block P1 constructed from these data blocks. Similarly, codeword CW2 includes data blocks D1, D5, D6, and D7, as well as parity block P2 constructed from these data blocks. Codeword CW3 includes data blocks D2, D5, D8, and D9, and parity block P3. Codeword CW4 includes data blocks D3, D6, D8, and XOR Parity, as well as parity block P4. Codeword CW5 includes data blocks D4, D7, D9, and XOR Parity, as well as parity block P5. In addition, the parities on the parity (POP) are constructed by combining row parities P1-P5 column-wise. The arrangement is configured to remove miscorrections because the same codeword will not be formed for different rows with changing data locations with permutations. All the data blocks are protected twice; however, the row parity is protected once. The parity on parity (POP) will add another level of protection to remove errors in parities.

Figure 2B:
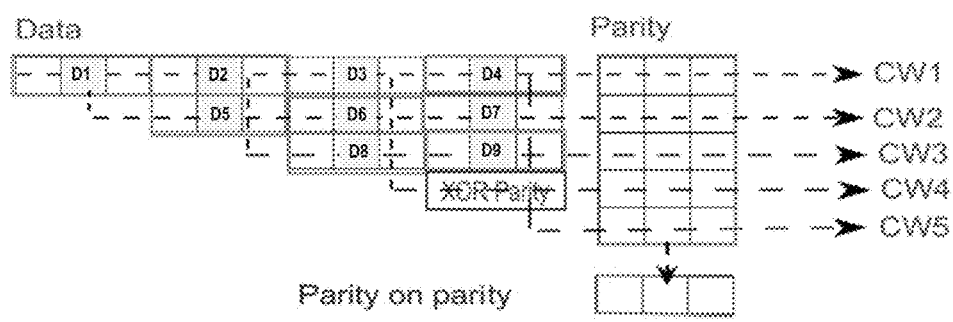
FIG. 2B is a simplified block diagram illustrating an exemplary construction of a generalized product code (GPC) in accordance with certain embodiments of the present invention.

In FIG. 2B, a specific example is shown to explain the construction of a GPC. However, the method described here can be used for any class of generalized product codes. For example, in other embodiments, the product code construction can be extended to higher dimensions. In an embodiment, data blocks can be protected three times in a three-dimensional generalized product code. In FIG. 2B, the number of data bits in a block, I, is taken as an integer, for example, from 8 to 16, but it can be given any value depending upon desired data length and code rate. Let Ncw be number of row codewords, which is equal to five in FIG. 2B, i.e., there are five codewords designated as CW1-CW5. In some embodiments, as shown in FIG. 2B, data blocks D1-D9 are arranged in a triangular matrix, with D1-D4 in the first row, D5-D7 in the second row, and D8 and D9 in the third row. The block designated as "XOR" or "XOR parity" is constructed by taking XOR (exclusive OR) of all data blocks D1-D9. The five codewords CW1-CW5 can be constructed by following the dotted arrow lines leading to each codeword. For example, codeword CW1 includes data blocks D1, D2, D3, and D4. Codeword CW2 includes data blocks D1, D5, D6, and D7. Codeword CW3 includes data blocks D2, D5, D8, and D9. Codeword CW4 includes data blocks D3, D6, D8, and XOR Parity. Codeword CW5 includes data blocks D4, D7, D9, and XOR Parity. FIG. 2A lists codewords CW1-CW5 showing all the data blocks in each codeword. In some embodiments, multiple XOR blocks can be formed, with each XOR block constructed based on a subset of all data blocks of information bits. The length of the "XOR parity" block is also equal to I. Each of the codeword also All row parities are further encoded by another constituent codes which is called parity-on-parity or POP. In this code construction, the decoding criterion is such that the data is decoded successfully if all Ncw codewords are decodable and XOR parity check is satisfied. This decoding criterion helps in avoiding miscorrections which can make a valid codeword in the regular TPC decoding criterion but it will not be a valid codeword with the modified decoding criterion. In this construction, XOR is used to correct stuck patterns.

In this example, it can be seen that every pair of constituent codewords share a common block of data bits with each other. In other words, the same block of data is contained in two codewords. For instance, data block D1 is in both CW1 and CW2, and therefore, CW1 and CW2 share data block D1. Similarly, CW1 and CW3 share data block D2, CW1 and CW4 share data block D3, and CW1 and CW4 share data block D4. Further, CW2 and CW3 share data block D5, CW3 and CW4 share data block D8, and CW4 and CW5 share the XOR data block, etc.

Figure 2C:
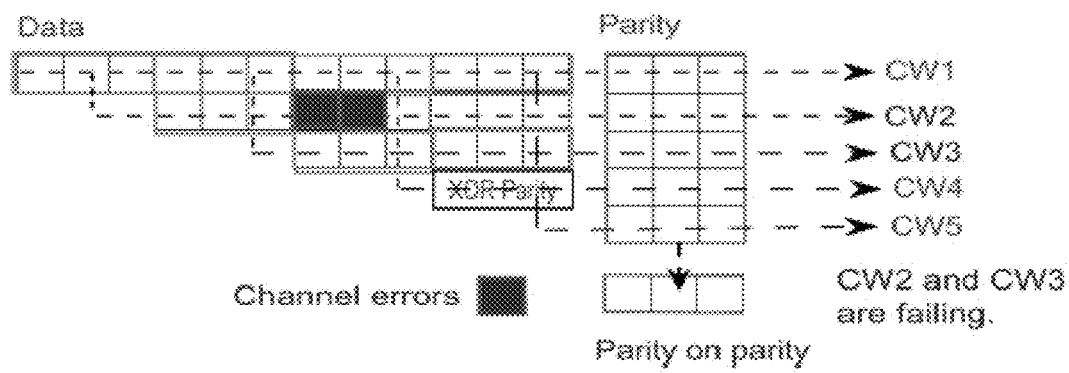
FIGS. 2C-2G are simplified block diagrams illustrating error correction examples in a generalized product code (GPC) in accordance with certain embodiments of the present invention.
Figure 2D:
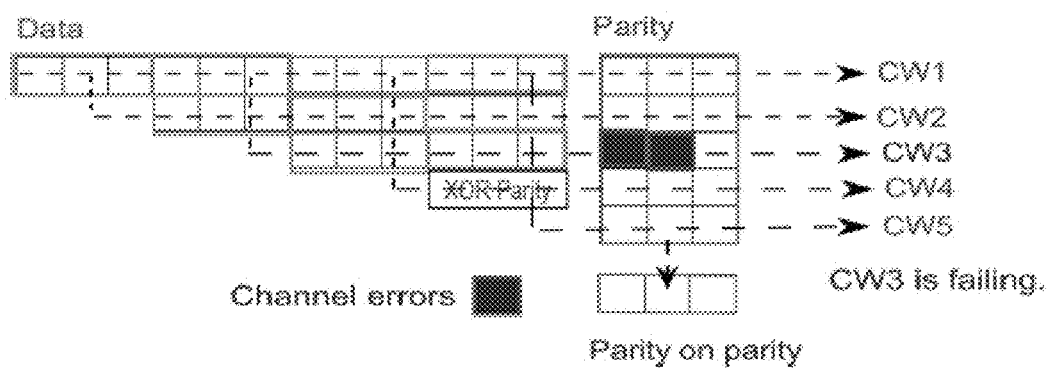
Figure 2E:
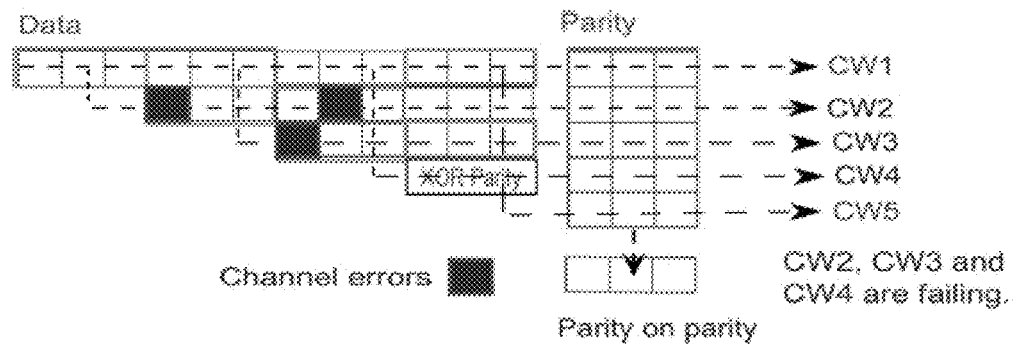
Figure 2F:
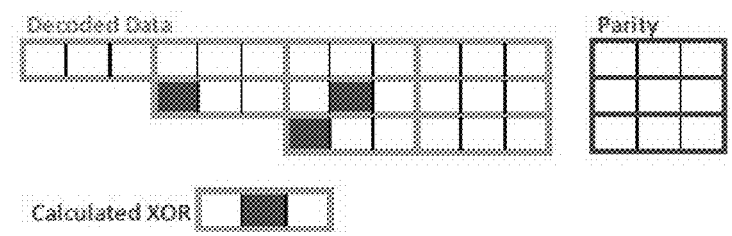
Figure 2G:
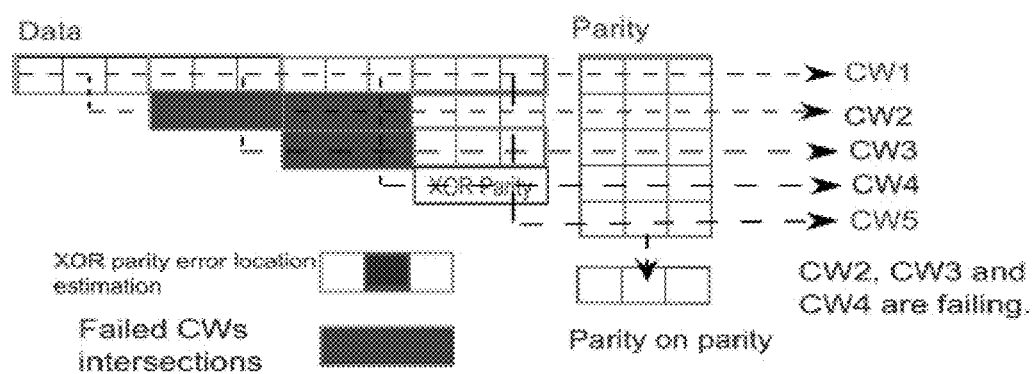

In FIG. 2C, the intersection of two failing codewords is corrected using XOR parity. In this example, the correction capability for constituent codes is assumed to be equal to 1. The stuck pattern shown in FIG. 2D can also be corrected through XOR parity by making correction in parity blocks. The decoding fails when there are three or more codewords failing (see FIG. 2E). The stuck pattern shown in FIG. 2E can be corrected in the following manner. First, the XOR parity is constructed through decoded data as shown in FIG. 2F and compare with XOR parity stored in the data. In this example, calculated XOR parity and stored XOR parity differ at one location which indicates that this is the possible error location (See FIG. 2G). The intersection of all pairs of failed codewords can contain the error at the estimated location. At failed error intersections, the flipping of the estimated bits can be tried and regular decoding can be performed. In this example, flipping in the intersection of CW2 and CW3 will not lead to successful decoding. However, flipping the bit in the intersection of CW2 and CW4 will decode all codewords successfully. In general, the value of I will be much larger than 3, and decoding through XOR parity can provide possible error locations better with large values of I and significantly reduce the number of flips for successful decoding. Let m error locations be provided through XOR parity and there are FI possible error location intersections. Then, 2m bit flips can be tried on those FI intersections to get the successfully decoded data. In general, the XOR parity can also be used to correct errors for the case where there are more than 3 row codewords failing.

Figure 3A:
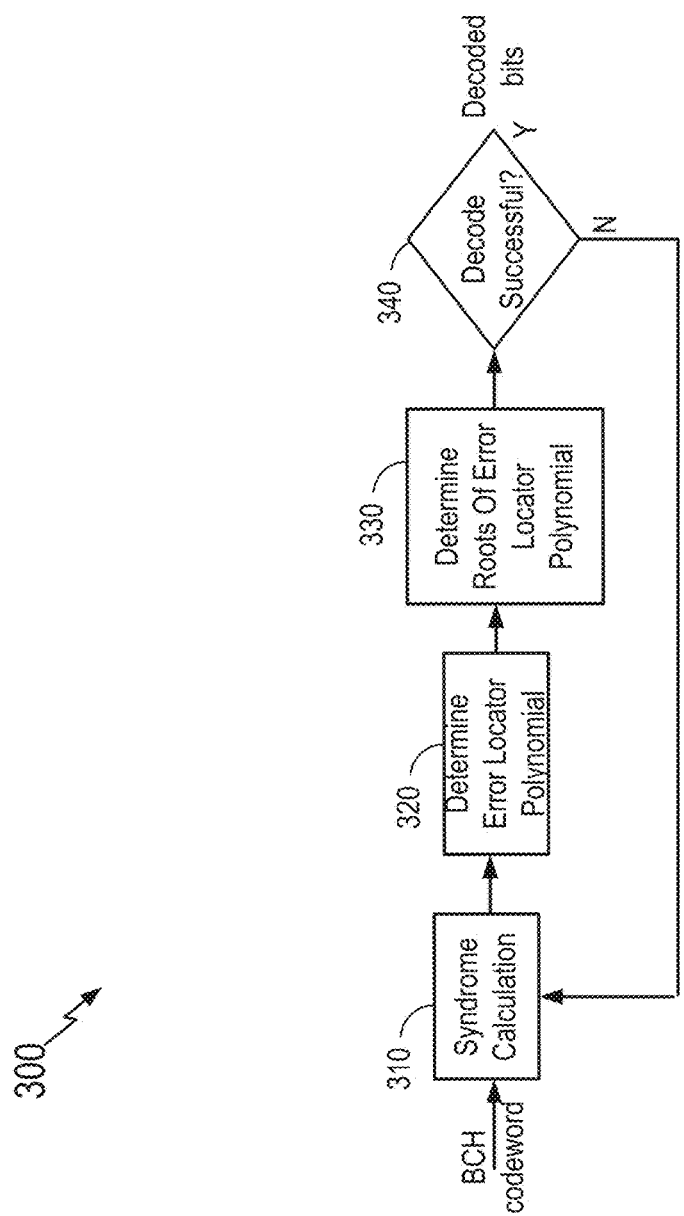
FIG. 3A is a simplified block diagram illustrating an example of a Bose-Chaudhuri-Hocquenghem (BCH) decoder in accordance with certain embodiments of the present invention.

In the GPC example described above, the constituent codes are represented by BCH codes. However, other coding schemes can also be used. FIG. 3A a simplified block diagram illustrating an example of a Bose-Chaudhuri-Hocquenghem (BCH) decoder 300 in accordance with certain embodiments of the present invention. As illustrated in FIG. 3A, the decoder receives a BCH codeword and starts an iterative decoding process. For each iteration, BCH decoder performs syndrome calculation (step 310) on the received codeword, determines error locator polynomial (step 320), and performs Chien search or similar procedures to determine roots of error locator polynomial (step 330). Roots of the error locator polynomial provide an indication of where the errors in the codeword are located. The error locations are used for error correction.

After correcting the errors, at 340, the decoder checks if the decoding process has resulted in a correct codeword. If so, the decoder outputs the decoded bits. Otherwise, the decoder may generate a bit flipping pattern, flip one or more bits of the codeword based on the pattern and calculate syndrome values of the new codeword. The decoding process may continue until a correct codeword is found and/or a predetermined maximum number of iterations is reached.

Given the natural numbers m and t, a t-error correcting binary BCH code of length $n=2^m-1$ may be defined as:

$$c(x) \in GF(2)[x]: \deg c(x) \leq n-1, c(\alpha) = c(\alpha^2) = c(\alpha^3) = \ldots = c(\alpha^{2t}) = 0$$

where $\alpha \in GF(2^m)$ is a primitive element. In other words, it is the set of all binary polynomials of degree not more than $n-1$ such that when these are treated as polynomials over $GF(2^m)$, they must have $\alpha, \alpha^2, \alpha^3, \ldots, \alpha^{2t}$ as their roots.

If $c(x)$ is the transmitted codeword, $e(x)$ is the error polynomial, and $R(x)=c(x)+e(x)$ is the received codeword, then given that $\alpha, \alpha^2, \alpha^3, \alpha^{2t}$ are roots of $c(x)$, an initial component syndrome may be calculated as:

$$S_i = r(\alpha^{i+1}) = e(\alpha^{i+1})$$

for $i=0, 1, \ldots, 2t-1$.

The error locator polynomial generator uses the syndromes $S_0, S_1, S_{2t-1}$ to generate the error location polynomial $\Lambda(x)$, which is defined as:

$$\Lambda(x) = \Pi_{i=1}^{v}(1-\alpha^{ji}x).$$

Several methods exist in the art for finding the locator polynomial for example, Berlekamp-Massey algorithm, Peterson's algorithm, and the like. The roots of the error location polynomial (i.e., $j_0, j_1, j_v$ in the equation above) indicate the locations of the errors, so finding the roots of the error location polynomial corresponds to finding the locations of the errors in a corresponding codeword.

Roots of the error location polynomial can be found using Chien search. For binary symbols, once the error locations have been identified, correction simply involves flipping the bit at each identified error location. For non-binary symbols, the error magnitude needs to be calculated, for example, using Forney Algorithm, to find out the magnitude of the correction to be made.

In general, a decoder for product codes may perform BCH decoding on one or more of the row constituent codes and/or column constituent codes iteratively to generate a correct codeword. For GPC, a decoder may perform BCH decoding on one or more of the row constituent codes iteratively to generate a correct codeword.

Figure 3B:
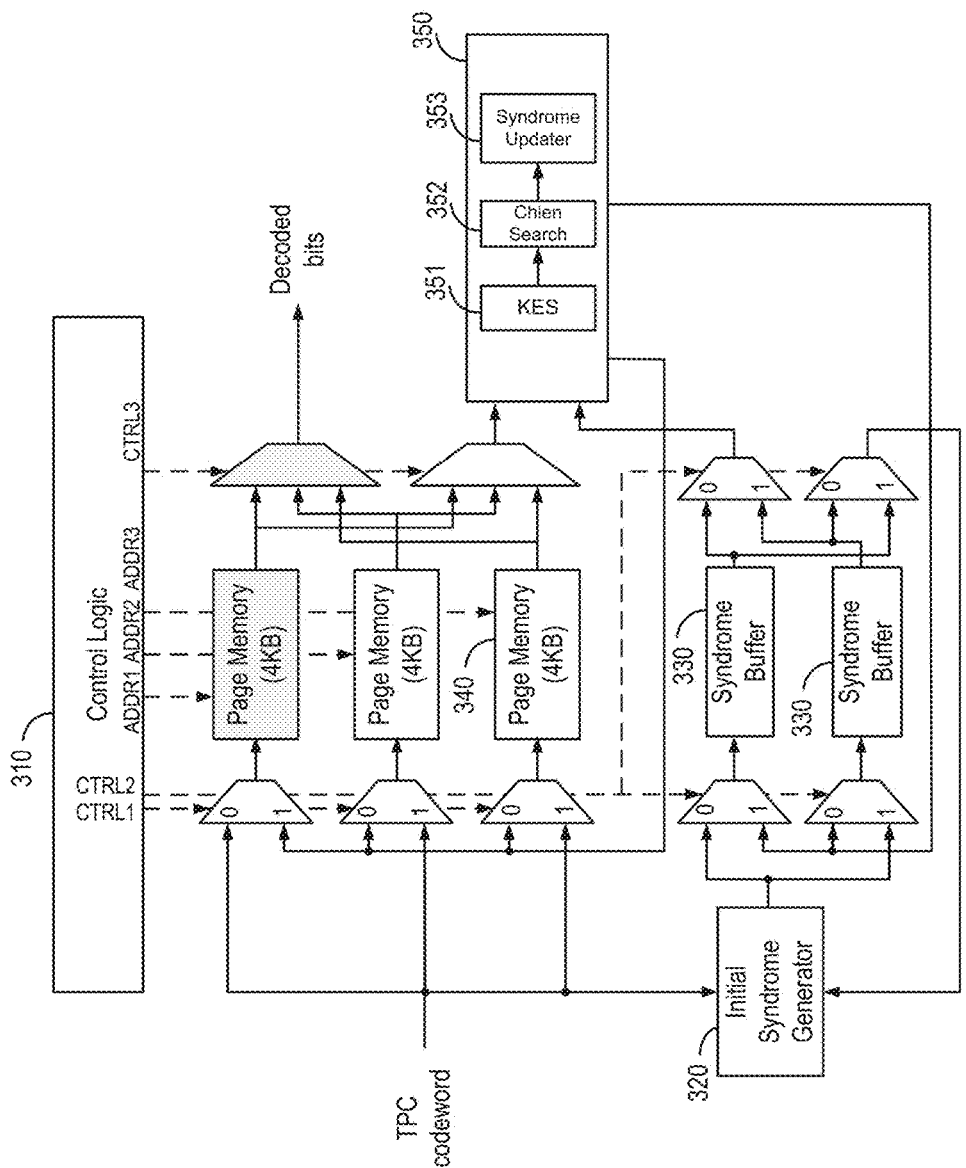
FIG. 3B is a block diagram illustrating a decoder in accordance with certain embodiments of the present invention.

FIG. 3B is a block diagram illustrating a decoder according to an embodiment. As illustrated, the decoder has a control logic 310, an initial syndrome generator 320, one or more syndrome buffers 330, one or more page memories 340, and decoder 350. The initial syndrome generator is used to generate initial values for the syndromes. For example, after receiving a new codeword, the initial syndrome generator generates one or more syndromes for the decoder and stores them in the syndrome buffers 330. During the decoding procedure, the decoder utilizes the stored syndrome values to decode the codewords and correct errors.

In one embodiment, after finding an error pattern, the decoder corrects the data stored in the memories 340 and also updates the corresponding syndrome values stored in the syndrome buffers 330.

Decoder 350 includes Key equation solver (KES) 351, Chien search 352, and syndrome updater 353. In one embodiment, the syndrome values are calculated by syndrome calculator 320 to initialize syndrome buffer 330. The decoder reads syndrome values from buffers during decoding iterations. After processing key equation solver (KES) 351 and Chien search 352, the decoder accesses page memory 340 and corrects the data based on the determined error patterns. Some or all of syndrome values are then updated in the syndrome buffer 330.

In one embodiment, the key equation solver is used to carry out the error location polynomial $\sigma(x)$, which may be defined as follows:

$$\sigma(x) = (1+x\beta_1)(1+x\beta_2)\ldots(1+x\beta_v) = 1+\sigma_1 x^1 + \sigma_2 x^2 + \sigma_3 x^3 \ldots + \sigma_v x^v.$$

The key equation describing the relation between $S(x)$ and $\sigma(x)$ may be derived as follows:

$$\Omega(x) = S(x) \times \sigma(x) \bmod x^{2t}$$

where $\Omega(x)$ is the error evaluator polynomial, $S(x)$ represents syndrome polynomial, and t represents error correction capability of the code. Two of the popular methods for solving the key equation are Berlekamp-Massey and modified Euclidean algorithms. After the key equation solver, Chien search is applied to find the roots of the error location polynomial $\sigma(x)$.

For a product code, parallel decoding can be used to improve the throughput. For example, multiple decoders can be used to perform decoding simultaneously. Alternatively, a BCH decoder can be implemented in several pipeline stages to improve the throughput of the overall GPC decoder. In an embodiment, the BCH decoder has three pipelines stages; the first stage is the syndrome initialization, the second stage is key equation solver (KES) and Chien search, and the third stage is syndrome updating. In this embodiment, two BCH decoders capable of running in parallel are implemented in the hardware to achieve the required throughput.

Figure 4:
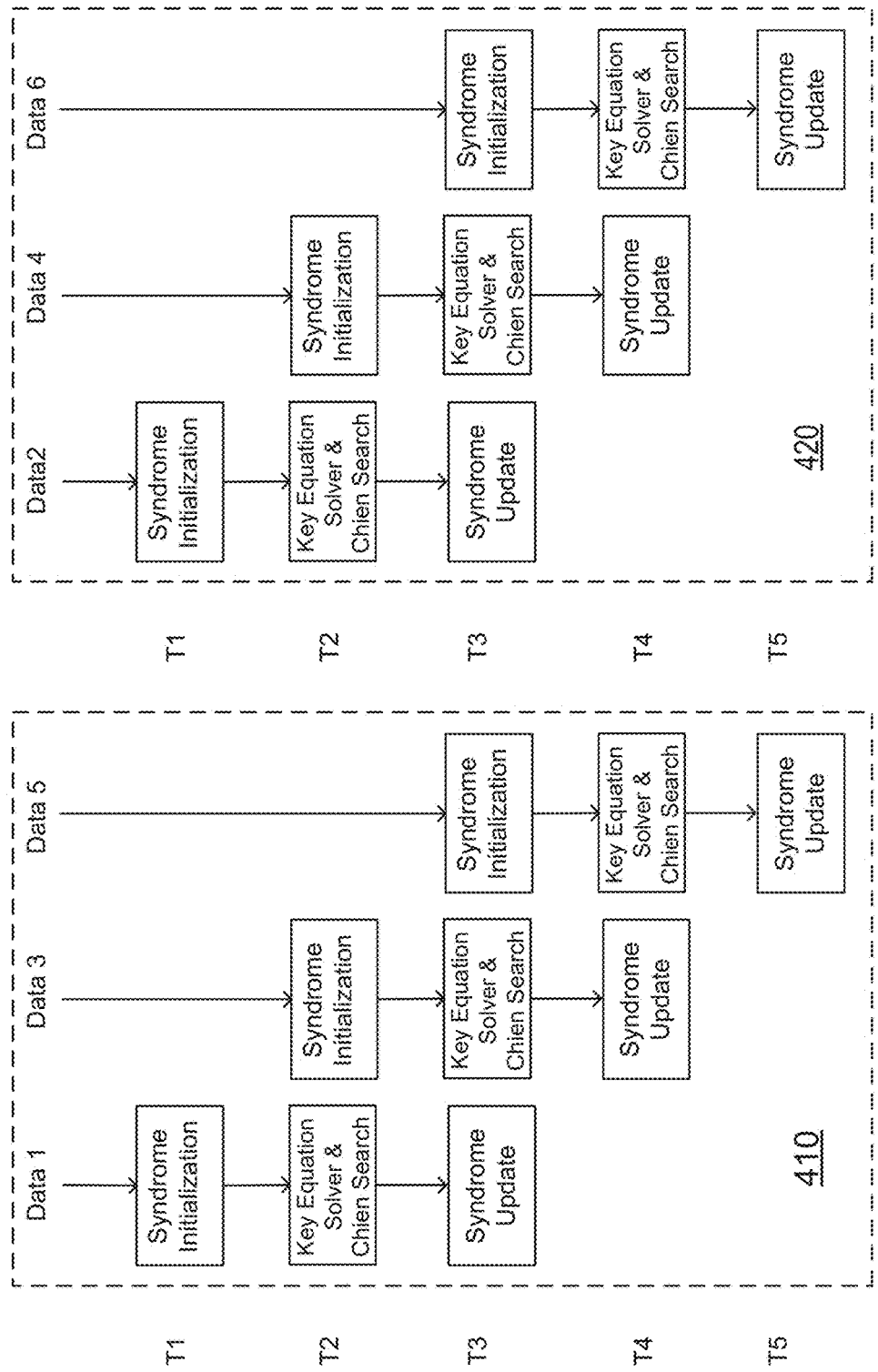
FIG. 4 is a simplified block diagram illustrating two pipelined decoders decoding six codewords in parallel in accordance with certain embodiments of the present invention.

FIG. 4 is a simplified block diagram illustrating two pipelined decoders decoding six codewords in parallel in accordance with certain embodiments of the present invention. It can be seen that two pipelined decoders 410 and 420 decode six codewords, Data 1 to Data 6, in parallel. During time T1, Data 1 is processed in Syndrome Initialization in decoder 410, and Data 2 is processed in Syndrome Initialization in decoder 420. During time T2, Data 1 is processed in Key Equation Solver and Chien Search, and Data 3 is processed in Syndrome Initialization in decoder 410. Simultaneously, during time T2, Data 2 is processed in Key Equation Solver and Chien Search, and Data 4 is processed in Syndrome Initialization in decoder 420. At a given time, six codewords could be processed in parallel. As explained above, in the GPC example, any two codewords share many data bits. In other embodiments of GPC, two codewords being processed in parallel can have a certain number of data bits or a block of data bits in common. The parallel decoding of two codewords at the same time can lead to clashes when both decoders update syndromes according to errors located in the intersection of the two decoded codewords. These clashes will occur more frequently when the number of parallel decoders is increased. This problem can also occur in parallel decoding in a single decoder with pipelined structure or operation.

In embodiments of the present invention, a coarse/fine decoding architecture is provided to avoid these clashes as described in detail below.

Coarse Decoding Phase

In the coarse decoding phase constituent codewords are scheduled for decoding on both decoders (dec-1 and dec-2, shown in FIG. 4 as 410 and 420) in parallel. With three pipeline stages for every decoder, one constituent codeword decoding can potentially correct errors in the intersections with the next five scheduled codewords. Any corrections made in the intersections with the next five scheduled codewords will make the decoding of the corresponding codewords void. For example, dec-1 decodes constituent codeword cw-1. It updates syndromes to correct errors in the intersection, i.e., shared common block of bits, of cw-1 and constituent codeword cw-2, as well as the intersection of the cw-1 and constituent codeword cw-3. Then, any updates by decoders decoding cw-2 and cw-3 will be ignored or prohibited.

Fine Decoding Phase

The coarse decoding phase may cause a deadlock such that the decoding of some codewords gets ignored for many iterations of decoding. To avoid this situation, the decoding architecture also provides a fine decoding phase after some number of iterations with the coarse decoding phase. In this phase, a single decoder without a pipeline structure is used for decoding constituent codewords after coarse decoding. This single decoder will be run slower, but, in most cases, very few constituent codewords are left un-decoded after an iteration of fine decoding is completed.

Certain embodiments of the invention provide an error correction apparatus configured for decoding a plurality of constituent codewords in parallel. In some embodiments, the error correction apparatus includes a memory and a processor coupled to the memory. The processor is configured to obtain a first message having a plurality of constituent codewords from the memory. The plurality of constituent codewords are derived from a message encoded in a product code in which each constituent codeword has multiple blocks of data bits, and every pair of constituent codewords share a common block of data bits with each other, wherein each constituent codeword corresponds to a class of error correcting codes capable of correcting a predetermined number of errors.

Figure 5:
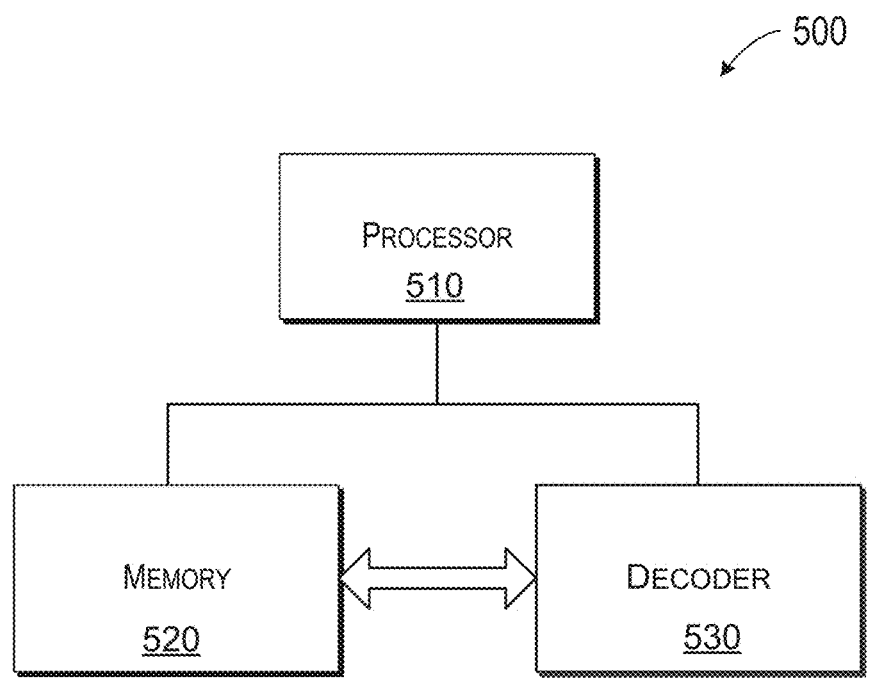
FIG. 5 is a simplified block diagram illustrating a memory device, such as a flash storage in accordance with certain embodiments of the present invention.

FIG. 5 is a simplified block diagram illustrating a memory device, such as a flash storage, according to an embodiment of the present invention. As shown in FIG. 5, memory device 500 includes a processor 510, a memory array 520 coupled to the processor, and a decoding apparatus 530. The decoding apparatus is configured to perform coarse decoding and fine decoding. In coarse decoding, the decoder decodes in parallel two or more codewords, which share a common block of bits, to determine error information. Next, the decoder corrects errors in a first codeword based on the error information. Here, the errors can be corrected at this point, or the errors can be marked for correction. Then, it is determined if the shared common block of data bits is corrected. If the shared common data block is updated, then error correction based on the error information is prohibited in codewords sharing the common block of data bits with the first codeword. In fine decoding, a single codeword is decoded at a time for error correction.

FIG. 5 can also represent a data decoding apparatus configured for decoding a plurality of codewords in parallel. As shown in FIG. 5, decoding apparatus 500 includes processor 510, a memory 520 coupled to the processor, and one or more decoders 520. Processor 510 is configured to read encoded data including a plurality of codewords. The plurality of codewords are encoded in a product code in which each codeword has multiple blocks of data bits and every two codewords share a common block with each other. Examples of the product code are described above in connection with FIGS. 2A-2G. The one or more decoders 530 are configured to perform parallel decoding of two or more codewords. Decoder 530 can include one or more decoders capable of pipeline operations for parallel decoding, such as decoders 410 and 420 in FIG. 4. The decoders can also perform sequential decoding by deactivating the pipeline operation. Decoding apparatus 500 is configured to perform coarse decoding and fine decoding, which is described below with reference to FIG. 6.

Figure 6:
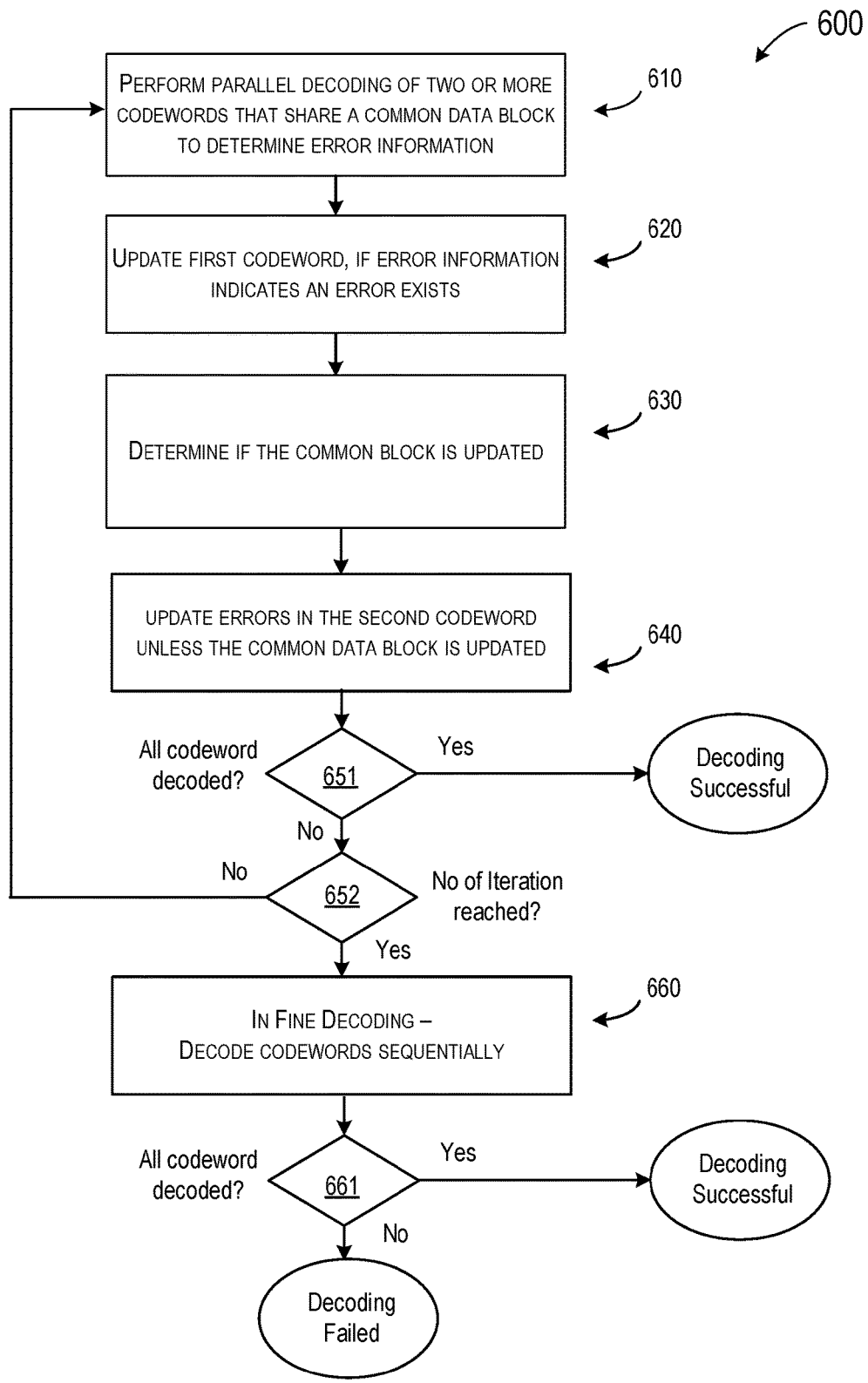
FIG. 6 is a simplified flow chart illustrating the operation of decoding apparatus 500 in accordance with certain embodiments of the present invention.

FIG. 6 is a simplified flow chart 600 illustrating the operation of decoding apparatus 500 according to an embodiment of the present invention. The operation includes the following processes. In process 610, the apparatus performs parallel decoding of two or more codewords that share a common data block to determine error information. In process 620, the apparatus updates the first codeword if the error information indicates that an error exists. In process 630, it is determined if the common data block between the first and second codewords is updated. In process 640, the decoding apparatus updates the second codeword based on the error information, unless the common block is updated in the decoding of the first codeword. The coarse decoding is repeated until the plurality of codewords are successfully decoded or until a predetermined number of iterations has been reached, as shown in processes 651 and 652. As shown in process 660, in the fine decoding, the codewords are decoded in fine decoding sequentially one at a time. Next, in process 661, it is determined if all codewords are decoded. If all codewords are decoded, the decoding is successful. Otherwise, the decoding has failed.

In coarse decoding, the parallel decoding can be performed by a single decoder with a pipeline structure. Alternatively, the coarse decoding can be performed by two or more decoders. In an embodiment, the fine decoding is performed by a single decoder with no pipeline operation. In some embodiments, each decoder is configured to solve an error location polynomial using a key equation solver. Each decoder can be configured to generate error information using Chien search. In some embodiments, each of the decoders can be configured for pipelined parallel decoding in three stages including syndrome initialization, key equation solver and Chien search, and syndrome update.

An example of the product code is the generalized product code (GPC) described above. In an embodiment, the encoded data or encoded message includes a group of data bits arranged in data blocks. The data blocks include blocks of information bits and one or more blocks of XOR bits. The XOR bits are formed by exclusive OR operation on the information bits. Each codeword includes a number of data blocks and parity bits, and the parity bits are formed by encoding the data blocks using an error-correcting coding scheme, e.g., BCH codes. The encoded data further includes parity-on-parity (POP) bits, which are formed by encoding the parity bits of the codewords using a second error-correcting coding scheme. The second error-correcting coding scheme can be the same as the first error-correcting coding scheme, or a different coding scheme. In this product code, each data block is included in two or more codewords, and every pair of codewords share a common data block. For this product code, the coarse decoding and fine decoding are described below in more detail with reference to FIGS. 7 and 8.

Figure 7:
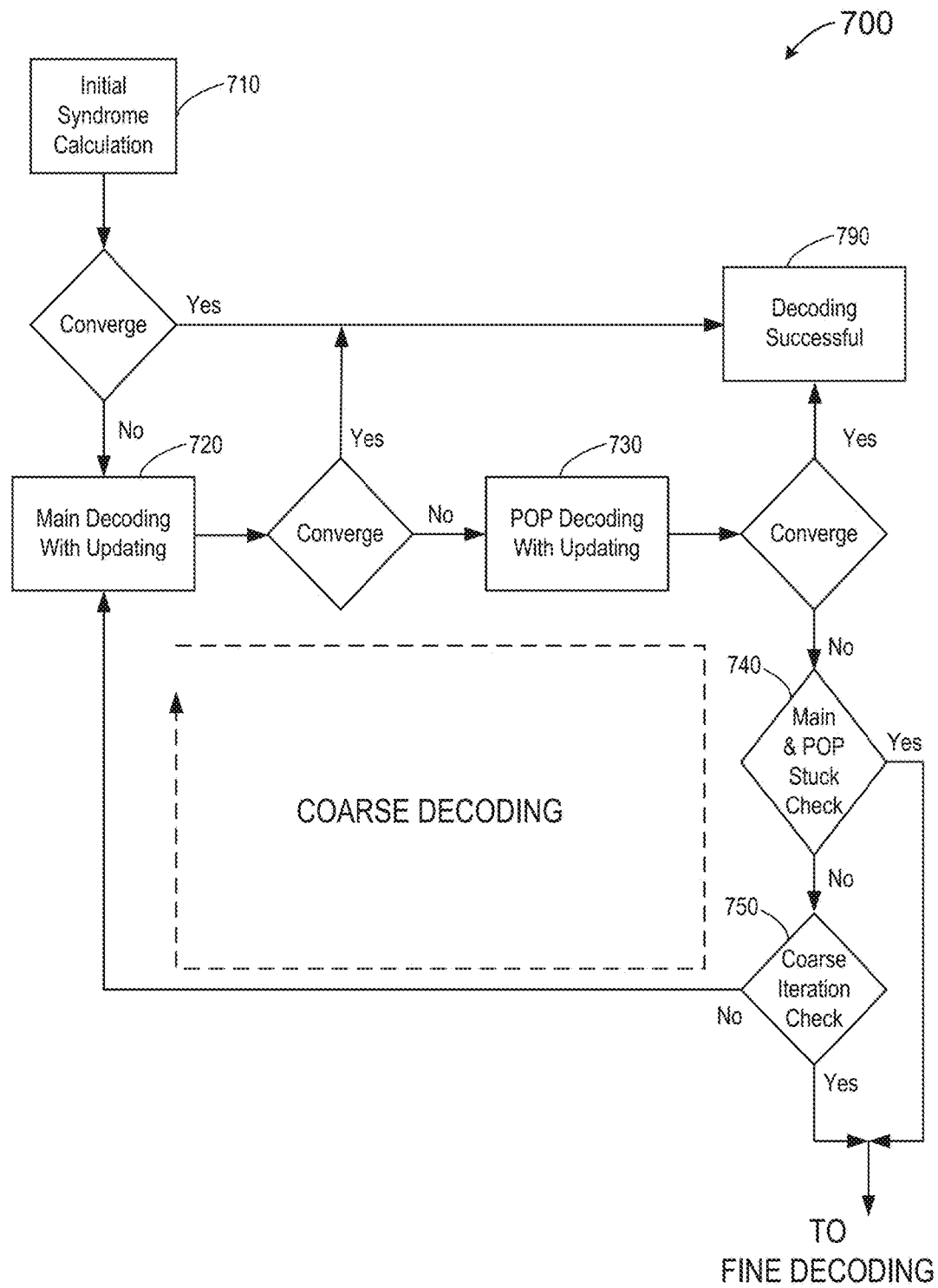
FIG. 7 is a simplified flow chart illustrating a coarse decoding operation in accordance with certain embodiments of the present invention.

FIG. 7 is a simplified flow chart illustrating a coarse decoding operation 700 according to an embodiment of the present invention. For this product code, the apparatus is configured to decode the plurality of codewords in parallel. In process 710, the initial syndrome calculation is performed. If this operation converges and no errors are found, then the decoding is successful. Otherwise, main decoding, which refers to decoding of the codewords, is performed as shown in process 720. Here, in each parallel decoding operation, two or more codewords are decoded in parallel, and a codeword is updated to correct errors unless a shared common data block is already updated or designated for update in this parallel decoding operation. If the plurality of codewords are not decoded successfully, then, at process 730, the parity bits and the POP bits are decoded and updated. In some embodiments, POP decoding is performed sequentially. This coarse decoding operation repeats the above decoding operations until all codewords are decoded successfully, 790, or until a preset number of iterations is reached. In FIG. 7, process 740, Main & POP Stuck Check, determines if the decoding is successful, and process 750, Coarse Iteration Check, determines if a preset number of iterations is reached. If the coarse decoding is not successful, then fine decoding is performed, which is described below with reference to FIG. 8.

Figure 8:
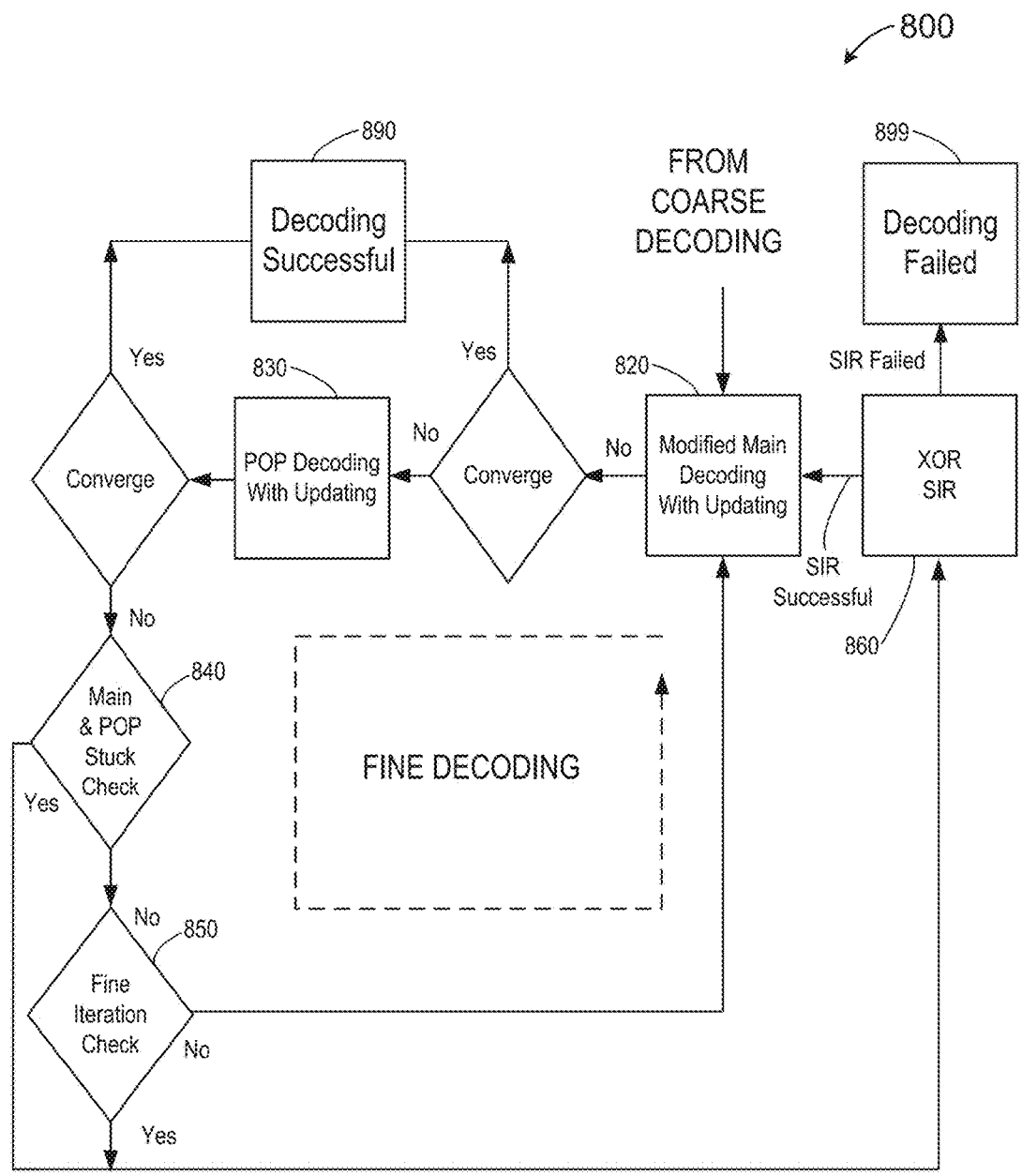
FIG. 8 is a simplified flow chart illustrating a fine decoding operation 800 in accordance with certain embodiments of the present invention.

FIG. 8 is a simplified flow chart illustrating a fine decoding operation 800 according to an embodiment of the present invention. In the fine decoding, the apparatus is configured to decode the plurality of codewords sequentially, one at a time, and the codeword is updated to correct errors. If the plurality of codewords are not decoded successfully, then the parity bits and the POP bits are decoded and updated. The decoding processes involved in fine decoding are similar to those in coarse decoding of FIG. 7, but are performed sequentially in fine decoding.

In process 820, Modified Main Decoding With Updating, the codewords are decoded sequentially, using a single decoder without a pipeline, and a codeword is updated to correct errors. If the plurality of codewords are not decoded successfully, then, in process 830, the parity bits and the POP bits are decoded and updated. This decoding operation repeats the above decoding operations until all codewords are decoded successfully, 890, or until a preset number of iterations is reached. In FIG. 8, process 840, Main & POP Stuck Check, determines if the decoding is successful, and process 850, Coarse Iteration Check, determines a preset number of iterations is reached. When fine decoding fails, in process 860, an XOR SIR operation can be performed, in which information provided by the XOR bits is used for stuck intersection recovery (SIR). An example of error location estimation through XOR parity and possible error intersection is described above in connection with FIGS. 2A-2G. If the SIR operation is successful, then the fine decoding is repeated. If this process fails, then the decoding operation is determined to have failed, process 899.

To evaluate the performance, we have simulated this proposed coarse/fine decoding architecture for different code rates and at different codeword failure rates (CFR). The results are shown in Tables 1-5 below. For comparison, we have assumed that there exists a hypothetical ideal decoder architecture, which is referred to as a Genie architecture, that runs a single BCH decoder with a single pipeline that can run at 6 times higher clock cycle. The Genie architecture provides the best throughput; however, it should be noted that this genie architecture is not practical and is only used for comparison purposes.

In Table 1 and Table 2, throughput and latency are compared for the proposed architecture at the highest code rate (1280B/16 KB) at CFR 1e-10 and 1e-6, respectively. Table 3 and Table 4 show throughput and latency for the proposed architecture at the lowest code rate (2048B/16 KB) at (CFR) 1e-10 and 1e-6, respectively.

TABLE 1

Throughput/latency for the proposed scheme at the highest code rate (1280 B/16 KB) at CFR 1e-10.

|  | Genie Architecture | Proposed Architecture |
|---|---|---|
| Average Num. of Pipeline Stages | 59.00 | 59.02 |
| Throughput @ 300 MHz | 1019 MB/s | 1019 MB/s |
| Avg. Latency @ 300 MHz | 8.66 us | 8.66 us |

TABLE 2

Throughput/latency for the proposed scheme at the highest code rate (1280 B/16 KB) at CFR 1e-6.

|  | Genie Architecture | Proposed Architecture |
|---|---|---|
| Average Num. of Pipeline Stages | 59.24 | 60.6 |
| Throughput @ 300 MHz | 1019 MB/s | 1019 MB/s |
| Avg. Latency @ 300 MHz | 8.66 us | 8.66 us |

TABLE 3

Throughput/latency for the proposed scheme at the lowest code rate (2048 B/16 KB) at CFR 1e-10.

|  | Genie Architecture | Proposed Architecture |
|---|---|---|
| Average Num. of Pipeline Stages | 67.55 | 78.51 |
| Throughput @ 300 MHz | 1016 MB/s | 875 MB/s |
| Avg. Latency @ 300 MHz | 9.06 us | 10.52 us |

TABLE 4

Throughput/latency for the proposed scheme at the lowest code rate (2048 B/16 KB) at CFR 1e-6.

|  | Genie Architecture | Proposed Architecture |
|---|---|---|
| Average Num. of Pipeline Stages | 81.18 | 95.31 |
| Throughput | 843 MB/s | 720 MB/s |
| Avg. Latency | 10.93 us | 12.79 us |

TABLE 5

Throughput loss due to the proposed architecture at lowest and highest code rates compared to genie architecture.

| Code Rate | CFR | Throughput Loss |
|---|---|---|
| 1280 B/16 KB | 1e-10 | 0% |
|  | 1e-6 | 0% |
| 2048 B/16 KB | 1e-10 | ~16% |
|  | 1e-6 | ~17% |

It can be seen that there is no throughput loss by the GPC architecture at the highest code rate, and, at the lowest rate, it has been observed that there has been small throughput loss from the proposed scheme.

The embodiments disclosed herein are not to be limited in scope by the specific embodiments described herein. Various modifications of the embodiments of the present invention, in addition to those described herein, will be apparent to those of ordinary skill in the art from the foregoing description and accompanying drawings. Further, although some of the embodiments of the present invention have been described in the context of a particular implementation in a particular environment for a particular purpose, those of ordinary skill in the art will recognize that its usefulness is not limited thereto and that the embodiments of the present invention can be beneficially implemented in any number of environments for any number of purposes.

Figure 9:
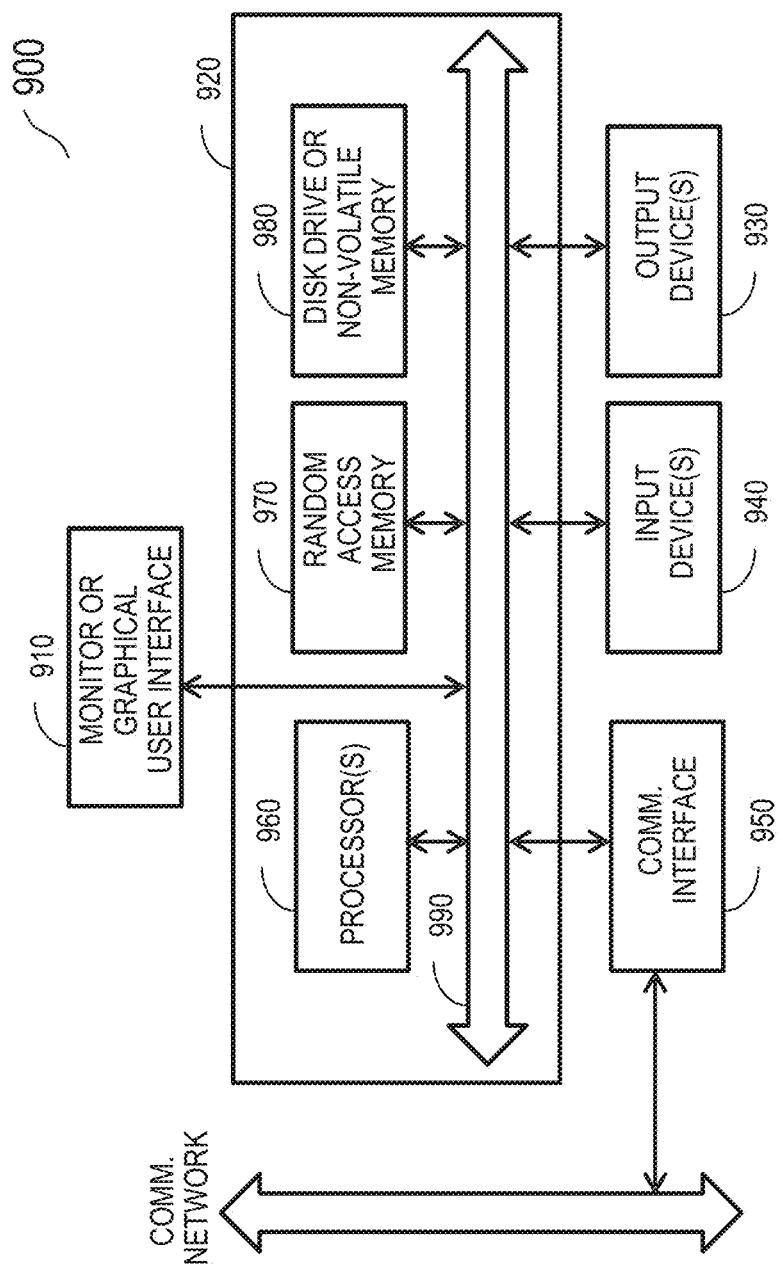
FIG. 9 is a simplified block diagram illustrating an apparatus that may be used to implement various embodiments according to the present invention.

FIG. 9 is a simplified block diagram illustrating an apparatus that may be used to implement various embodiments according the present invention. FIG. 9 is merely illustrative of an embodiment incorporating the present invention and does not limit the scope of the invention as recited in the claims. One of ordinary skill in the art would recognize other variations, modifications, and alternatives. In one embodiment, computer system 900 typically includes a monitor 910, a computer 920, user output devices 930, user input devices 940, communications interface 950, and the like.

As shown in FIG. 9, computer 920 may include a processor(s) 960 that communicates with a number of peripheral devices via a bus subsystem 990. These peripheral devices may include user output devices 930, user input devices 940, communications interface 950, and a storage subsystem, such as random access memory (RAM) 970 and disk drive 980.

User input devices 940 can include all possible types of devices and mechanisms for inputting information to computer system 920. These may include a keyboard, a keypad, a touch screen incorporated into the display, audio input devices such as voice recognition systems, microphones, and other types of input devices. In various embodiments, user input devices 940 are typically embodied as a computer mouse, a trackball, a track pad, a joystick, wireless remote, drawing tablet, voice command system, eye tracking system, and the like. User input devices 940 typically allow a user to select objects, icons, text and the like that appear on the monitor 910 via a command such as a click of a button or the like.

User output devices 930 include all possible types of devices and mechanisms for outputting information from computer 920. These may include a display (e.g., monitor 910), non-visual displays such as audio output devices, etc.

Communications interface 950 provides an interface to other communication networks and devices. Communications interface 950 may serve as an interface for receiving data from and transmitting data to other systems. Embodiments of communications interface 950 typically include an Ethernet card, a modem (telephone, satellite, cable, ISDN), (asynchronous) digital subscriber line (DSL) unit, FireWire interface, USB interface, and the like. For example, communications interface 950 may be coupled to a computer network, to a FireWire bus, or the like. In other embodiments, communications interfaces 950 may be physically integrated on the motherboard of computer 920, and may be a software program, such as soft DSL, or the like.

In various embodiments, computer system 900 may also include software that enables communications over a network such as the HTTP, TCP/IP, RTP/RTSP protocols, and the like. In alternative embodiments of the present invention, other communications software and transfer protocols may also be used, for example IPX, UDP or the like. In some embodiments, computer 920 includes one or more Xeon microprocessors from Intel as processor(s) 960. Further, one embodiment, computer 920 includes a UNIX-based operating system.

RAM 970 and disk drive 980 are examples of tangible storage media configured to store data such as embodiments of the present invention, including executable computer code, human readable code, or the like. Other types of tangible storage media include floppy disks, removable hard disks, optical storage media such as CD-ROMS, DVDs and bar codes, semiconductor memories such as flash memories, read-only-memories (ROMS), battery-backed volatile memories, networked storage devices, and the like. RAM 970 and disk drive 980 may be configured to store the basic programming and data constructs that provide the functionality of the present invention.

Software code modules and instructions that provide the functionality of the present invention may be stored in RAM 970 and disk drive 980. These software modules may be executed by processor(s) 960. RAM 970 and disk drive 980 may also provide a repository for storing data used in accordance with the present invention.

RAM 970 and disk drive 980 may include a number of memories including a main random access memory (RAM) for storage of instructions and data during program execution and a read only memory (ROM) in which fixed non-transitory instructions are stored. RAM 970 and disk drive 980 may include a file storage subsystem providing persistent (non-volatile) storage for program and data files. RAM 970 and disk drive 980 may also include removable storage systems, such as removable flash memory.

Bus subsystem 990 provides a mechanism for letting the various components and subsystems of computer 920 communicate with each other as intended. Although bus subsystem 990 is shown schematically as a single bus, alternative embodiments of the bus subsystem may utilize multiple busses.

FIG. 9 is representative of a computer system capable of embodying the present invention. It will be readily apparent to one of ordinary skill in the art that many other hardware and software configurations are suitable for use with the present invention. For example, the computer may be a desktop, portable, rack-mounted or tablet configuration. Additionally, the computer may be a series of networked computers. Further, the use of other microprocessors are contemplated, such as Pentium™ or Itanium™ microprocessors; Opteron™ or AthlonXP™ microprocessors from Advanced Micro Devices, Inc.; and the like. Further, other types of operating systems are contemplated, such as Windows®, WindowsXP®, WindowsNT®, or the like from Microsoft Corporation, Solaris from Sun Microsystems, LINUX, UNIX, and the like. In still other embodiments, the techniques described above may be implemented upon a chip or an auxiliary processing board.

Various embodiments of the present invention can be implemented in the form of logic in software or hardware or a combination of both. The logic may be stored in a computer readable or machine-readable non-transitory storage medium as a set of instructions adapted to direct a processor of a computer system to perform a set of steps disclosed in embodiments of the present invention. The logic may form part of a computer program product adapted to direct an information-processing device to perform a set of steps disclosed in embodiments of the present invention. Based on the disclosure and teachings provided herein, a person of ordinary skill in the art will appreciate other ways and/or methods to implement the present invention.

The data structures and code described herein may be partially or fully stored on a computer-readable storage medium and/or a hardware module and/or hardware apparatus. A computer-readable storage medium includes, but is not limited to, volatile memory, non-volatile memory, magnetic and optical storage devices such as disk drives, magnetic tape, CDs (compact discs), DVDs (digital versatile discs or digital video discs), or other media, now known or later developed, that are capable of storing code and/or data. Hardware modules or apparatuses described herein include, but are not limited to, application-specific integrated circuits (ASICs), field-programmable gate arrays (FPGAs), dedicated or shared processors, and/or other hardware modules or apparatuses now known or later developed.

The methods and processes described herein may be partially or fully embodied as code and/or data stored in a computer-readable storage medium or device, so that when a computer system reads and executes the code and/or data, the computer system performs the associated methods and processes. The methods and processes may also be partially or fully embodied in hardware modules or apparatuses, so that when the hardware modules or apparatuses are activated, they perform the associated methods and processes. The methods and processes disclosed herein may be embodied using a combination of code, data, and hardware modules or apparatuses.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A decoding apparatus configured for decoding a plurality of codewords in parallel, comprising:
   a memory;
   a processor coupled to the memory, the processor configured to read encoded data from the memory, wherein the encoded data includes a group of data bits arranged in data blocks, the encoded data including a plurality of data codewords that are encoded in a product code, wherein each data block is included in two codewords, and every two codewords share a common data block with each other; wherein the encoded data includes K data blocks arranged in L codewords, wherein K and L are integers, wherein each of the K data blocks is included in two of the L codewords, and wherein, in any two of the L codewords, a first codeword includes a data block that is also included in the other codeword; and
   one or more decoders, configured to perform parallel decoding of two or more codewords;
   wherein the apparatus is configured to perform coarse decoding;
   wherein in the coarse decoding, the apparatus is configured to:
      perform parallel decoding of two or more codewords to determine error information;
      update a first codeword if the error information indicates that an error exists by flipping an error bit based on the error information;
      determine if the common block between the first and second codewords is updated; and
      update the second codeword by flipping an error bit based on the error information, unless the common block is updated in the decoding of the first codeword.

2. The apparatus of claim 1, wherein the apparatus is configured to perform fine decoding, in which the codewords are decoded sequentially, wherein the apparatus is configured to perform fine decoding only if it is determined that the coarse decoding has failed to decode the plurality of codewords.

3. The apparatus of claim 2, wherein the coarse decoding is repeated until the plurality of codewords are successfully decoded or until a predetermined number of iterations has been reached.

4. The apparatus of claim 2, wherein the coarse decoding is performed by a single decoder with a pipeline structure.

5. The apparatus of claim 2, wherein the coarse decoding is performed by two or more decoders.

6. The apparatus of claim 2, wherein the fine decoding is performed by a single decoder with no pipeline operation.

7. The apparatus of claim 2, wherein:
   the encoded data comprises a group of data bits arranged in data blocks, the data blocks including blocks of information bits;
   each codeword including a number of data blocks and parity bits, the parity bits formed by encoding the data blocks using an error-correcting coding scheme;
   the encoded data further including parity-on-parity (POP) bits, which are formed by encoding the parity bits of the codewords using a second error-correcting coding scheme;
   wherein each data block is included in two or more codewords, and every pair of codewords share a common data block.

8. The apparatus of claim 7, wherein, in the coarse decoding, the apparatus is configured to:
   decode the plurality of codewords, wherein, in each parallel decoding operation, two or more codewords are decoded in parallel, and a codeword is updated to correct errors unless a shared common data block is previously updated in said parallel decoding operation;
   if the plurality of codewords are not decoded successfully, decode and update the parity bits and the POP bits; and
   repeat the above decoding operations until all codewords are decoded successfully or until a preset number of iterations is reached.

9. The apparatus of claim 7, wherein, in the fine decoding, the apparatus is configured to:
   decode the plurality of codewords, wherein each codeword is decoded sequentially and updated to correct errors;
   if the plurality of codewords are not decoded successfully, decode and update the parity bits and the POP bits; and
   repeat the above decoding operations until all codewords are decoded successfully or until a preset number of iterations is reached.

10. The decoding apparatus of claim 1, wherein the plurality of codewords are encoded in the product code by arranging a plurality of data blocks and optional one or more parity blocks in a triangular matrix of N columns by N rows, N being an integer, such that column 1 comprises one data block, column 2 comprises two data blocks, . . . , and column N comprises N data blocks, and that row 1 comprises N data blocks, row 2 comprises N−1 data blocks, . . . , and row N comprises one data block, and
   wherein the codewords are formed such that:
      codeword 1 comprises N data blocks in row 1;
      codeword 2 comprises the one data block in column 1 and N−1 data blocks in row 2;
      codeword 3 comprise the two data blocks of column 2, and N−2 data blocks in row 3;
      codeword 4 comprise the three data blocks of column 3, and N−3 data blocks in row 4;
      . . . ;
      codeword N−1 comprises the N−2 data blocks of column N−2 and two data blocks in row N−1;

codeword N comprises N−1 data blocks of column N−1 and one data block in row N; or the codewords are formed as described above, with rows and columns reversed;

whereby any pair of codewords share a common data block, and each data block is included in two codewords.

11. A memory device, comprising:
a memory array;
a processor coupled to the memory array; and
a decoding apparatus configured to perform coarse decoding and fine decoding;
wherein in coarse decoding, the decoding apparatus is configured to:
decode in parallel two or more codewords, which shares a common data block, to determine error information, wherein each of the two or more codewords includes a number of data blocks, and a first of the two or more codewords includes a data block that is also included in another of the two or more codewords;
correct errors in the first codeword by flipping error bits based on the error information; and
determine if the shared common data block is corrected, and, if so determined, prevent error correction based on the error information in codewords sharing a common data block with the first codeword;
and
wherein in fine decoding, the decoding apparatus is configured to sequentially decode a single codeword at a time for error correction.

12. The memory device of claim 11, wherein the decoding apparatus is configured to decode a plurality of codewords that are encoded in a product code in which each codeword has multiple data blocks and every two codewords share a common block with each other.

13. The memory device of claim 11, wherein the decoding apparatus is configured to decode encoded data, wherein:
the encoded data comprises a group of data bits arranged in data blocks, the data blocks including blocks of information bits;
each codeword including a number of data blocks and parity bits, the parity bits formed by encoding the data blocks using an error-correcting coding scheme;
the encoded data further includes parity-on-parity (POP) bits, which are formed by encoding the parity bits of the codewords using a second error-correcting coding scheme;
wherein each data block is included in two or more codewords, and every pair of codewords share a common data block.

14. The memory device of claim 13, wherein, in the coarse decoding, the apparatus is configured to:
decode the plurality of codewords, wherein, in each parallel decoding operation, two or more codewords are decoded in parallel, and a codeword is updated to correct errors unless a shared common data block is updated in said parallel decoding operation;
if the plurality of codewords are not decoded successfully, decode and update the parity bits and the POP bits; and
repeat the above decoding operations until all codewords are decoded successfully or until a preset number of iterations is reached.

15. The memory device of claim 13, wherein, in the fine decoding, the apparatus is configured to:
decode the plurality of codewords, wherein each codeword is decoded sequentially, and the codeword is updated to correct errors;
if the plurality of codewords are not decoded successfully, decode and update the parity bits and the POP bits; and
repeat the above decoding operations until all codewords are decoded successfully or until a preset number of iterations is reached.

16. A method for decoding data, the method comprising:
reading, from a memory, encoded data including multiple data blocks arranged in a plurality of codewords, each data block having data bits;
decoding, in parallel, two or more codewords that share a common data block to determine error information, wherein each of the two or more codewords includes a number of data blocks, and a first of the two or more codewords includes a data block that is also included in another of the two or more codewords;
correcting errors in the first codeword by flipping error bits based on the error information;
determining if the shared common data block is corrected, and, if so determined, preventing error correction based on the error information in codewords sharing a common data block with the first codeword.

17. The method of claim 16, further comprising:
decoding a single codeword at a time sequentially for error correction.

18. The method of claim 16, wherein:
the encoded data comprises a group of data bits arranged in data blocks, the data blocks including blocks of information bits;
each codeword including a number of data blocks and parity bits, the parity bits formed by encoding the data blocks using an error-correcting coding scheme;
the encoded data further includes parity-on-parity (POP) bits, which are formed by encoding the parity bits of the codewords using a second error-correcting coding scheme;
wherein each data block is included in two or more codewords, and every pair of codewords share a common data block.

19. The method of claim 18, further comprising:
in coarse decoding, performing parallel decoding of the plurality of codewords; and
if the coarse decoding is unsuccessful, performing fine decoding in which the codewords are decoded sequentially.

20. The method of claim 19, further comprising, in the coarse decoding,
decoding the plurality of codewords, wherein, in each parallel decoding operation, two or more codewords are decoded in parallel, and a codeword is updated to correct errors unless a shared common data block is updated in this parallel decoding operation;
if the plurality of codewords are not decoded successfully, decoding and updating the parity bits and the POP bits; and
repeating the above decoding operations until all codewords are decoded successfully or until a preset number of iterations is reached.

21. The method of claim 19, further comprising, in the fine decoding:
decoding the plurality of codewords, wherein each codeword is decoded sequentially, and the codeword is updated to correct errors;

if the plurality of codewords are not decoded successfully, decoding and updating the parity bits and the POP bits; and repeating the above decoding operations until all codewords are decoded successfully or until a preset number of iterations is reached.

* * * * *